(12) United States Patent
Alper et al.

(10) Patent No.: US 9,768,311 B2
(45) Date of Patent: Sep. 19, 2017

(54) SEMICONDUCTOR TUNNELING DEVICE

(71) Applicant: ECOLE POLYTECHNIQUE FEDERALE DE LAUSANNE (EPFL), Lausanne (CH)

(72) Inventors: Cem Alper, Lausanne (CH); Livio Lattanzio, Lausanne (CH); Mihai Adrian Ionescu, Ecublens (CH); Luca De Michielis, Lausanne (CH); Nilay Dagtekin, Lausanne (CH)

(73) Assignee: ECOLE POLYTECHNIQUE FEDERALE DE LAUSANNE (EPFL) (CH)

( * ) Notice: Subject to any disclaimer, the term of this patent is extended or adjusted under 35 U.S.C. 154(b) by 0 days.

(21) Appl. No.: 14/803,809

(22) Filed: Jul. 20, 2015

(65) Prior Publication Data
US 2016/0043234 A1 Feb. 11, 2016

(30) Foreign Application Priority Data
Jul. 24, 2014 (WO) .. INTELL PCT/IB2014/063389

(51) Int. Cl.
*H01L 29/93* (2006.01)
*H01L 29/786* (2006.01)
*H01L 29/66* (2006.01)
*B82Y 10/00* (2011.01)
*H01L 29/423* (2006.01)
*H01L 29/06* (2006.01)
*H01L 29/739* (2006.01)
*H01L 29/775* (2006.01)

(52) U.S. Cl.
CPC ........ *H01L 29/78648* (2013.01); *B82Y 10/00* (2013.01); *H01L 29/0676* (2013.01); *H01L 29/42356* (2013.01); *H01L 29/66439* (2013.01); *H01L 29/66977* (2013.01); *H01L 29/7391* (2013.01); *H01L 29/78696* (2013.01); *H01L 29/775* (2013.01)

(58) Field of Classification Search
CPC ......... H01L 29/78648; H01L 29/66977; H01L 29/78696
USPC ....................................................... 257/600
See application file for complete search history.

(56) References Cited

U.S. PATENT DOCUMENTS

| 4,835,581 A | 5/1989 | Kuroda et al. |
| 5,021,841 A | 6/1991 | Leburton et al. |
| 2013/0064005 A1 | 3/2013 | Heyns et al. |

(Continued)

*Primary Examiner* — David S Blum
(74) *Attorney, Agent, or Firm* — Sheridan Ross P.C.

(57) ABSTRACT

The present invention concerns a semiconductor tunneling Field-Effect device including a source, a drain, at least one elongated semiconductor structure extending in an elongated direction, a first gate, and a second gate. The first gate has a length extending in said elongated direction and is positioned on a first side of the at least one elongated semiconductor structure, and the second gate has a length extending in said elongated direction and is positioned on a second opposing side of the at least one elongated semiconductor structure. The first and second gates extend along the first and second sides of the at least one elongated semiconductor structure to define an overlap zone sandwiched between the first gate and the second gate, said overlap zone extending the full length of the first and/or second gate along the at least one elongated semiconductor structure.

18 Claims, 14 Drawing Sheets

(56) References Cited

U.S. PATENT DOCUMENTS

2014/0167146 A1\* 6/2014 Kang ................. H01L 29/7391
           257/329
2015/0179800 A1\* 6/2015 Biswas ............... H01L 29/7855
           365/189.011

\* cited by examiner

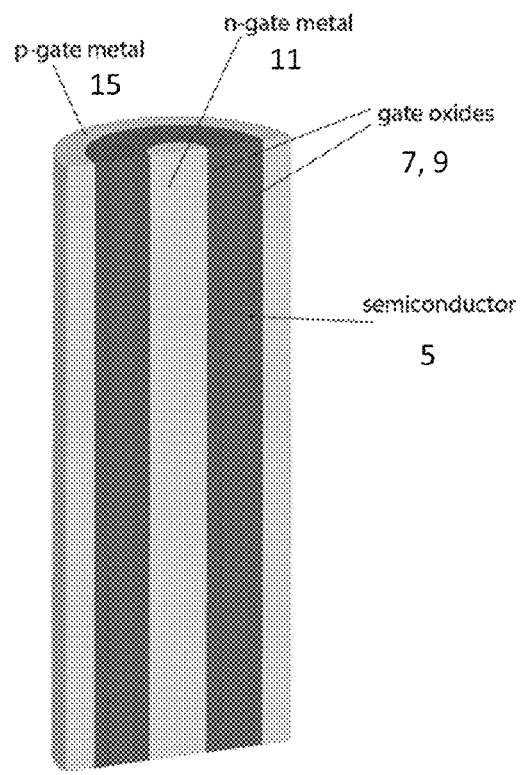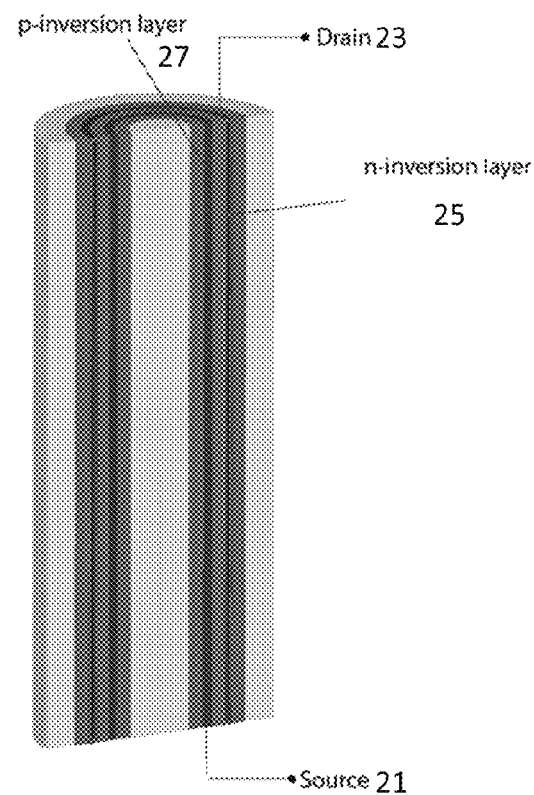
FIGURE 8(a)　　　FIGURE 8(b)
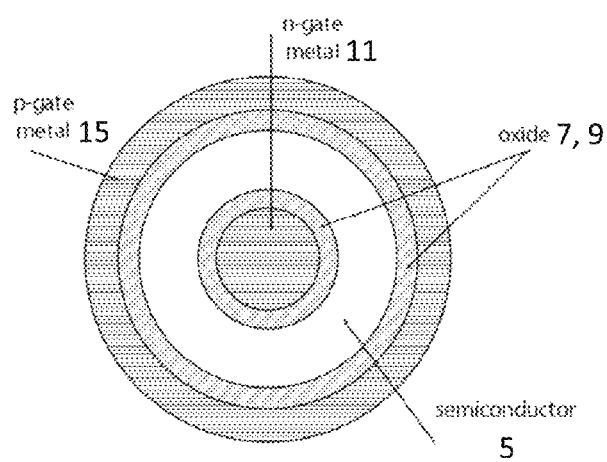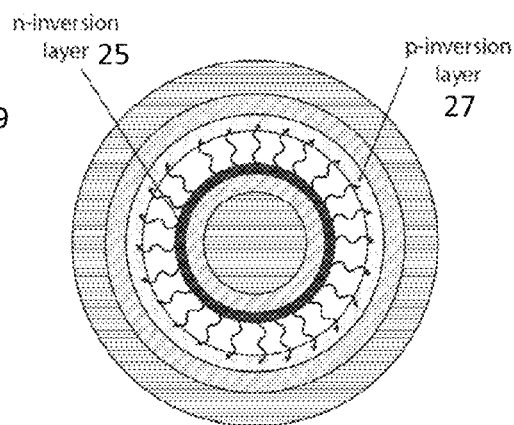
FIGURE 8(c)　　　FIGURE 8(d)

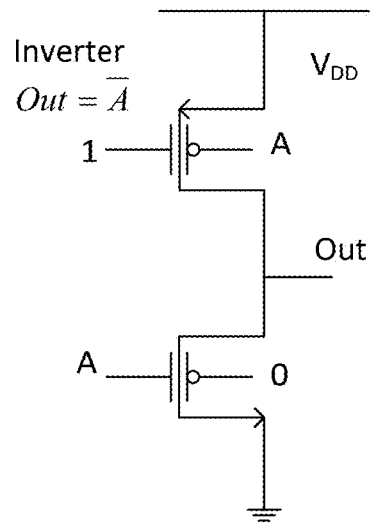
Figure 10(a)
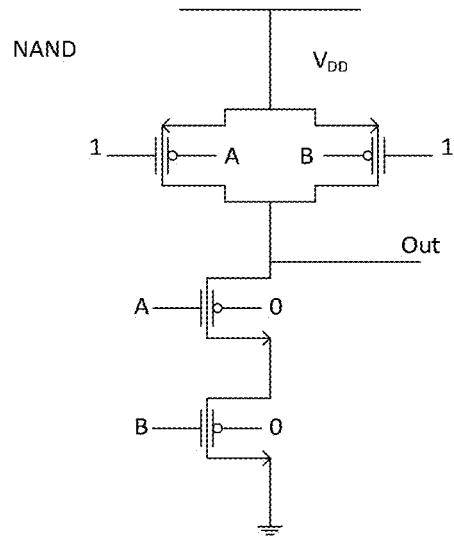
Figure 10(b)
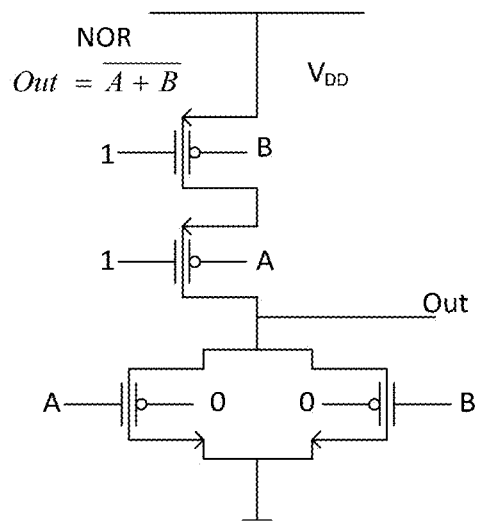
Figure 10(c)
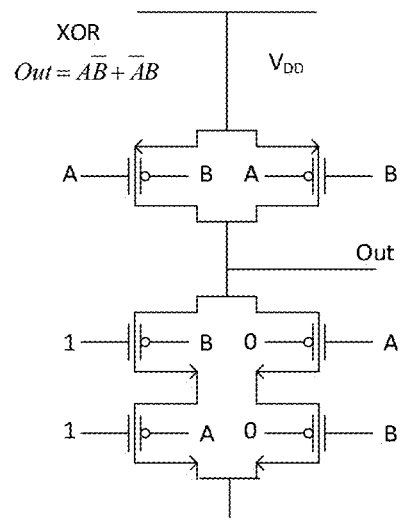
Figure 10(d)
FIGURE 10

SEMICONDUCTOR TUNNELING DEVICE

CROSS-REFERENCE TO RELATED APPLICATIONS

This application claims the benefit of PCT application No. PCT/IB2014/063389, filed Jul. 24, 2014, the entire contents of which are incorporated herein by reference.

FIELD OF THE INVENTION

The present invention relates to a semiconductor tunneling device and particularly to a semiconductor device using band-to-band tunneling (BTBT). More particularly, the present invention relates to a semiconductor transistor device. The present invention also relates to a method for fabricating said device. The present invention further concerns logic circuits or gates comprising the device according to the present invention and a logic scheme implementing logic functions.

BACKGROUND

The constant scaling of the geometry and the supply voltage used in integrated circuits (IC) is pushing the existing metal-oxide-semiconductor field effect transistor (MOSFET) technology to its limits, especially in terms of the switching slope (SS), which is defined as the derivative of log $I_D$ with respect to the gate voltage $V_{GS}$[1]:

$$SS = \underbrace{\frac{\partial V_G}{\partial \psi_S}}_{m} \underbrace{\frac{\partial \psi_S}{\partial (\log_{10} I_D)}}_{n}$$

where m is the transistor body factor which depends on the electrostatic control of the channel and n depicts the change in the drain current with respect to changes in the surface potential. It is well known that MOSFETs or any other semiconductor device that relies on thermionic emission of charge carriers is ultimately limited by an SS of 60 mV/dec at room temperature due to the uncompressible limitation of the n factor equation above [2]. As a consequence of this, for a MOSFET device, a gate voltage difference of at least 60 mV is needed to achieve an order of magnitude increase in drain current. This uncompressible SS stands as one of the major problems of modern ICs, due to the fact that circuits cannot have high performance and low standby power consumption at the same time.

To solve this issue, a novel transistor type called Tunnel FETs (TFET) has been proposed. TFETs rely on the peculiar quantum mechanical effect called band-to-band tunneling (BTBT). BTBT effect has been well-known for decades and has been successfully exploited in devices such as the Esaki (tunnel) diodes [3]. The main advantage of the TFET is the demonstrated ability to overcome the 60 mV/dec limitation [4] since it overcomes the n factor limitation stated above for thermionic devices like MOSFET.

However, the efforts to create a TFET structure that is able to compete against the state of the art CMOS technology have met several obstacles. The most pronounced of these problems is the extremely low current levels at ON state, which stems from the fact that device geometry is sub-optimal in maximizing the tunneling rate [5]-[7]. This issue of low ON current necessitates more optimized structures which can offer both the steep transition slope as well as high ON currents.

In order to overcome this difficulty, a novel device architecture called the Electron Hole Bilayer Tunnel FET (EHBTFET) was proposed and studied by the inventors themselves and other scientists in several publications [8]-[12]. The device utilizes the tunneling between electrostatically-induced two-dimensional electron and hole gases (2DEG and 2DHG, respectively). The device architecture consists of a thin semiconductor layer sandwiched between two asymmetrically-placed gate stacks as seen in FIG. 1. The energy band structure is such that BTBT occurs only when the energy levels of the electron and hole gases align. Since the channel is very thin, the tunneling distance from one carrier layer to the other is very small and hence the tunneling rate is much higher compared to the conventional TFETs. This enables the EHBTFET to have a step-like (<<60 mV/dec) turn-on characteristic [12].

Even though the EHBTFET device characteristics are extremely promising, there are several issues with its original implementation which undermine its feasibility. First, the process flow for the integration of such thin semiconductors with asymmetrically placed gates is highly non-trivial. The second issue is scaling; the underlap regions which are required to suppress the leakage current from the source and drain cannot be shrunk below a certain value, which adds additional undesired area in the device layout. Finally, the underlap regions add an extra amount of capacitance which slows the device switching.

SUMMARY

The invention is a four terminal semiconductor device (transistor) which utilizes band-to-band tunneling (BTBT) and a novel logic scheme using this device.

The device includes a semiconductor substrate 3 as well as a low bandgap semiconductor 5, such as Indium Arsenide or Indium Antimonide, which sits on the substrate 3. The low bandgap semiconductor 5 is sandwiched between substantially L-shaped n-gate and p-gate dielectric 7, 9 and terminal contacts 11, 15.

The device also includes source 17 and drain 19 regions of opposite conductivity types. BTBT is enabled when the quantized energy levels of the electron and hole gases align.

Since the conduction is dependent on the biasing of both the n-gate 11 and p-gate 15 terminals, the device uniquely combines n-type and p-type transistor behavior and therefore can be used to implement any digital logic function with a significant reduction in transistor count compared to standard CMOS technology.

DESCRIPTION OF THE DRAWINGS

The above object, features and other advantages of the present invention will be best understood from the following detailed description in conjunction with the accompanying drawings, in which:

FIG. 10(a) shows an inverter;
FIG. 10(b) shows a NAND;
FIG. 10(c) shows a NOR;
FIG. 10(d) shows an XOR.

DETAILED DESCRIPTION OF THE INVENTION

The invention uses the same conduction mechanism as the EHBTFET, but also contains significant modifications aiming to eliminate or greatly suppress the aforementioned issues.

Figure 2:
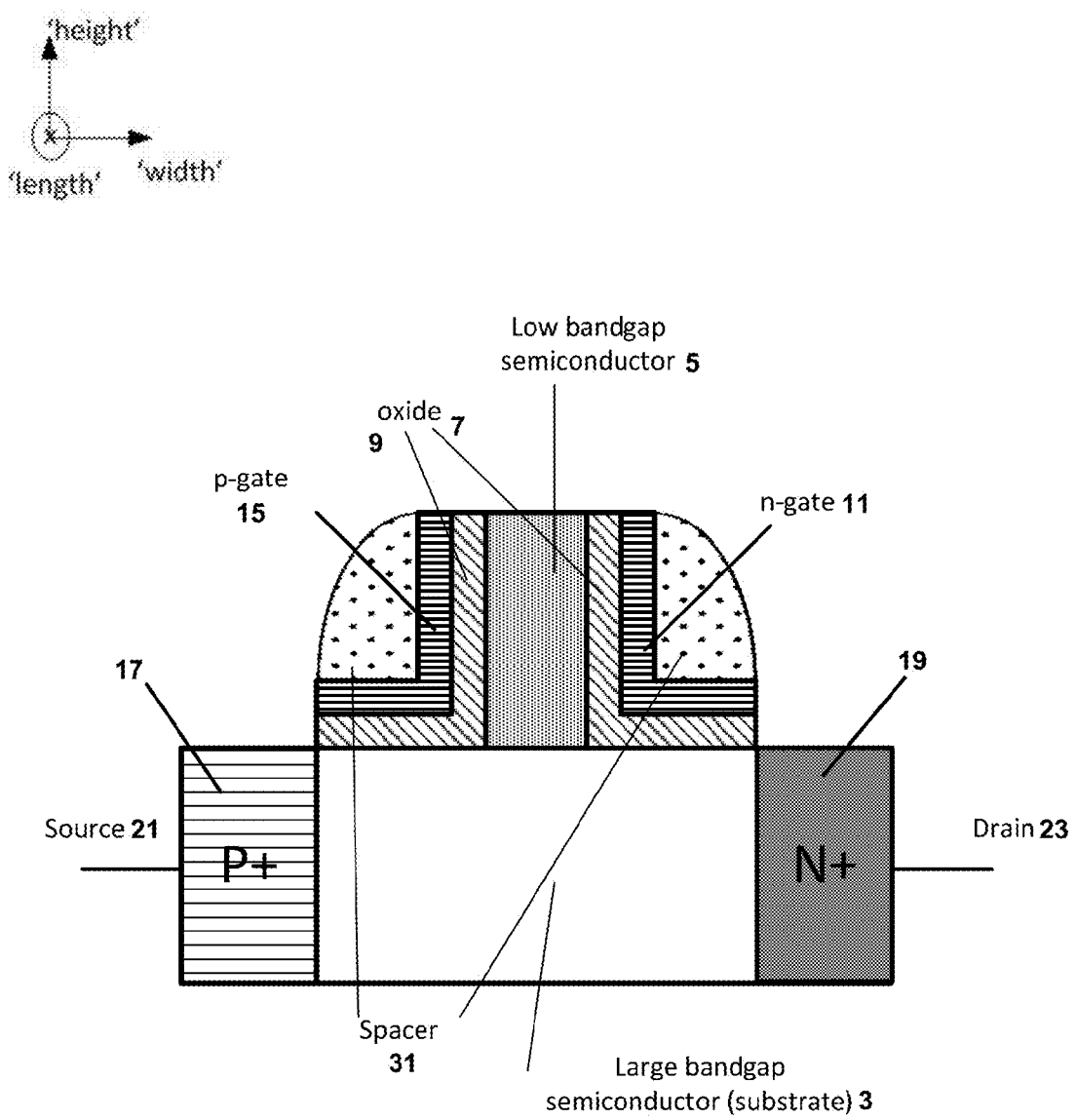
FIG. 2 illustrates a device architecture according to the present invention.

The invention is a semiconductor device consisting or comprising of four terminals, namely n-gate 11, p-gate 15, source 21 and drain 23 (see FIG. 2).

Figure 3:
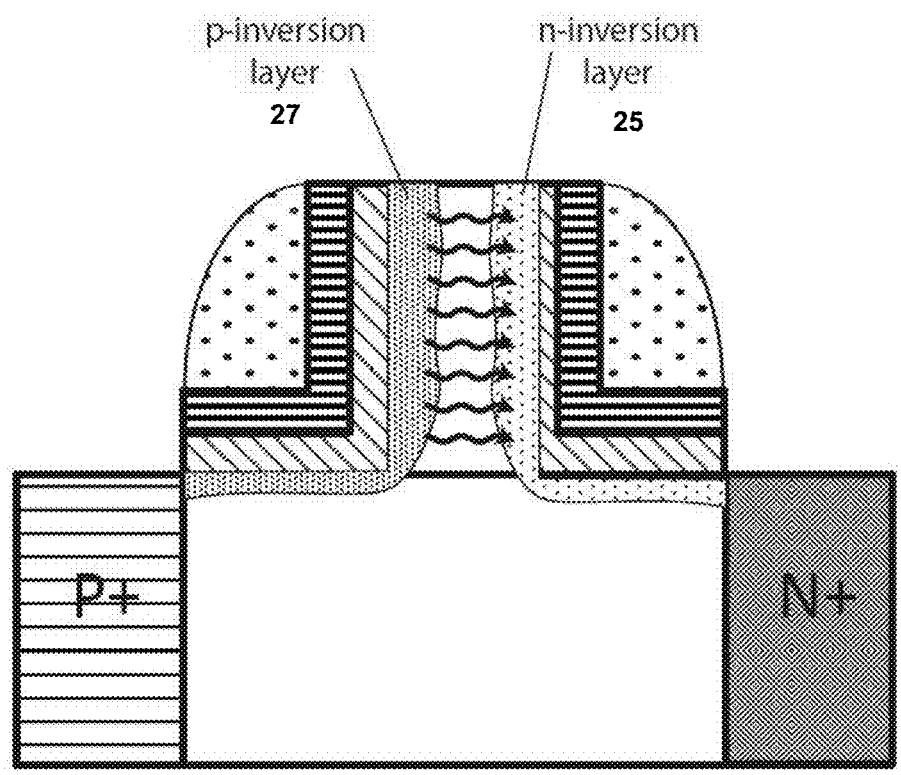
FIG. 3 illustrates the device working principle where BTBT between induced electron and hole inversion layers are indicated by the arrows.

The n-gate 11 and p-gate 15 terminals are used to control the voltage bias on the two gate stacks for the formation of the electron and hole inversion layers 25, 27, respectively (see FIG. 3).

The gate stacks consist of or comprise a substantially L-shaped dielectric (SiO2, HfO2 or any other insulator material) layer 7, 9 and gate contact material 11, 15 (metal or any other appropriate alloy). The n-gate and p-gate stack can have the same or different configuration.

The low bandgap semiconductor 5 forms, for example, an elongated fin structure whose cross-sectional view is shown in FIGS. 2 and 3. In FIGS. 2 and 3 the elongated fin structure extends in an elongated direction out of the page.

A fin structure can be defined for example as a protruding element comprising extending walls and an interconnecting top section. The walls extend outwards from a body (the substrate 3) and are interconnected by the top section at an extremity of the structure. The top section is for example substantially perpendicular to the extending walls. With reference to FIG. 2, the height of each wall is equal to or greater than the width of the top section. For example, the height of each wall is at least two times (or more) the width of the top section.

With respect to the substrate 3, the low bandgap semiconductor 5 extends substantially perpendicularly outwards from a surface of the substrate 3 to form the fin structure. The fin structure includes substantially vertical or upwardly extending sidewalls, extending from the substrate surface.

FIGS. 2 and 3 provide a cross-sectional view of the p-gate 15 and n-gate 11. The p-gate 15 has a length (not-illustrated) extending in the elongated direction of the low bandgap semiconductor 5 and the exemplary fin structure and the p-gate 15 is positioned on a first side of the low bandgap semiconductor 5 or fin structure. The n-gate 11 also has a length extending in the elongated direction and is positioned on a second opposing side of the low bandgap semiconductor 5 or fin structure.

The p-gate 15 and the n-gate 11 extend along the first and second sides of the low bandgap semiconductor 5 (sides walls of the fin structure) and define an overlap zone sandwiched between the p-gate 15 and the n-gate 11. A channel of the device is defined by the overlap zone.

The overlap zone can for example extend the full length of the p-gate 15 and/or the n-gate 11.

In one embodiment the overlap zone extends the full length and full height (in the substantially vertical direction of the side walls of the fin structure) of the p-gate 15 or the n-gate 11.

In a preferred embodiment the overlap zone extends the full length and full height (height being in the substantially vertical direction of the side walls of the fin structure) of the p-gate 15 and the n-gate 11 and the device has no under-layer (is under-layer less).

For example, the n-gate 11 and the dielectric layer 7 are mirror symmetrically positioned on the second side of the low bandgap semiconductor 5 with respect to the p-gate 15 and the dielectric layer 9 on the first side of the low bandgap semiconductor 5 (see FIGS. 2 and 3).

The p-gate 15 and the n-gate 11 symmetrically positioned or placed on opposite sides of the low bandgap semiconductor 5. For example, there is no offset between the p-gate 15 and the n-gate 11.

The drain terminal 23 is connected to the n+ doped region 19, which serves as a contact to the n-inversion layer 25 under the presence of an appropriate n-gate voltage. Finally, the source terminal 21 is connected to the p+ doped region 17, which serves as a contact to the p-inversion layer 27 under the presence of an appropriate p-gate voltage.

The spacer regions 31 suppress the direct source-to-drain BTBT conduction. It should be noted that this new structure allows these spacer regions 31 to be much smaller (on the order of 10-20 nm) compared to the EHBTFET described in the previous section and illustrated in FIG. 1, since the substrate region 3 employs a large-bandgap material.

The spacer regions 31 extend in the elongated direction of the low bandgap semiconductor 5.

Table 1 below provides exemplary values for typical dimensions of the principal characteristic features of the device according to the present invention.

The defined directions of 'width', 'height' and 'length' are shown in FIG. 2.

TABLE 1

| | |
|---|---|
| Fin width | 10 nm |
| Fin height | 30-100 nm |
| Fin length | 100 nm-1 µm |
| Gate metal height | 5 nm |
| Gate metal length | 100 nm-1 µm |
| Gate oxide height | 1.3 nm-3 nm |
| Gate oxide length | 100 nm-1 µm |
| Spacer height | 20-90 nm |
| Spacer length | 100 nm-1 µm |
| Spacer width | 10-20 nm |
| N+/P+ regions width | 50-200 nm |

By applying an asymmetric bias (in the sense that typically a positive bias is applied to the n-gate whereas typically a negative bias is applied to the p-gate) to the n- and p-gates, as soon as the quantized energy levels of the n- and p-inversion layers 25, 27 align, BTBT allows a steep increase in the device current (illustrated in FIG. 3 by the black arrows crossing one inversion layer to the other): with this alignment the device switches to the ON state.

Figure 4A:
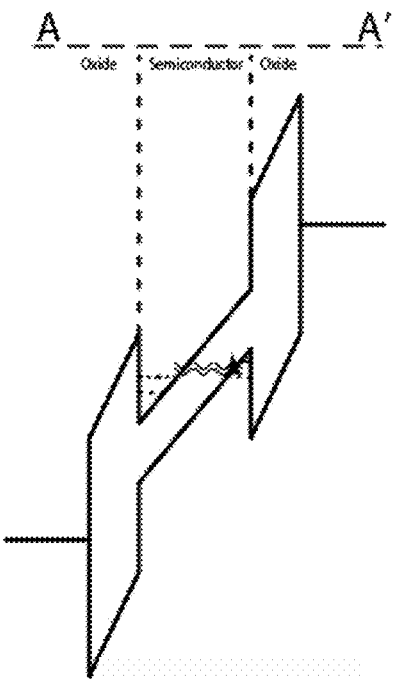
in FIG. 4(a) an ON state is shown where the first hole subband energy level is higher than the first electron subband energy level and hence conduction can occur.
Figure 4C:
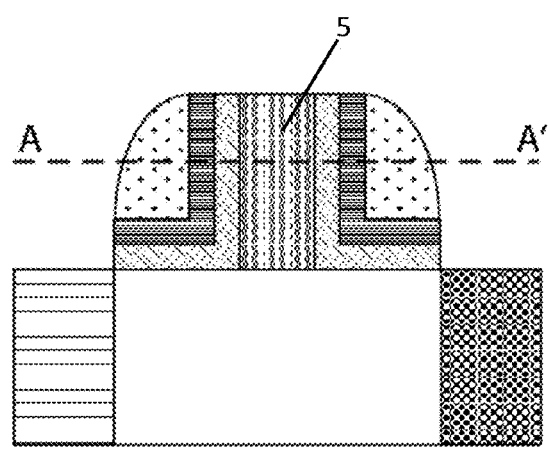
FIGS. 4 (a) and 4(b) shows an energy band diagram of the device of the present invention taken through the cross section A-A' of the device illustrated in FIG. 4(c) where discrete quantized energy levels are denoted as dashed and dotted lines in the semiconductor.
in FIG. 4(b) an OFF state is shown where the first hole subband energy level is lower than the first electron subband energy level and hence no conduction is observed.
Figure 4B:
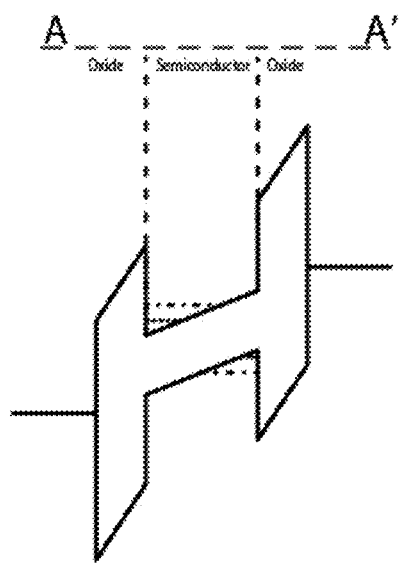

FIGS. 4(a) and (b) provide a representative energy band diagram cut through the low-bandgap region 5 of the device in FIG. 4(c), indicating the energy level placements in the ON and OFF states. Since the inversion layers 25, 27 (channels through which current can pass) are essentially two-dimensional carrier gases, the step-like density of states allows for a very steep switching slope [13].

Figures 1A, 1B:
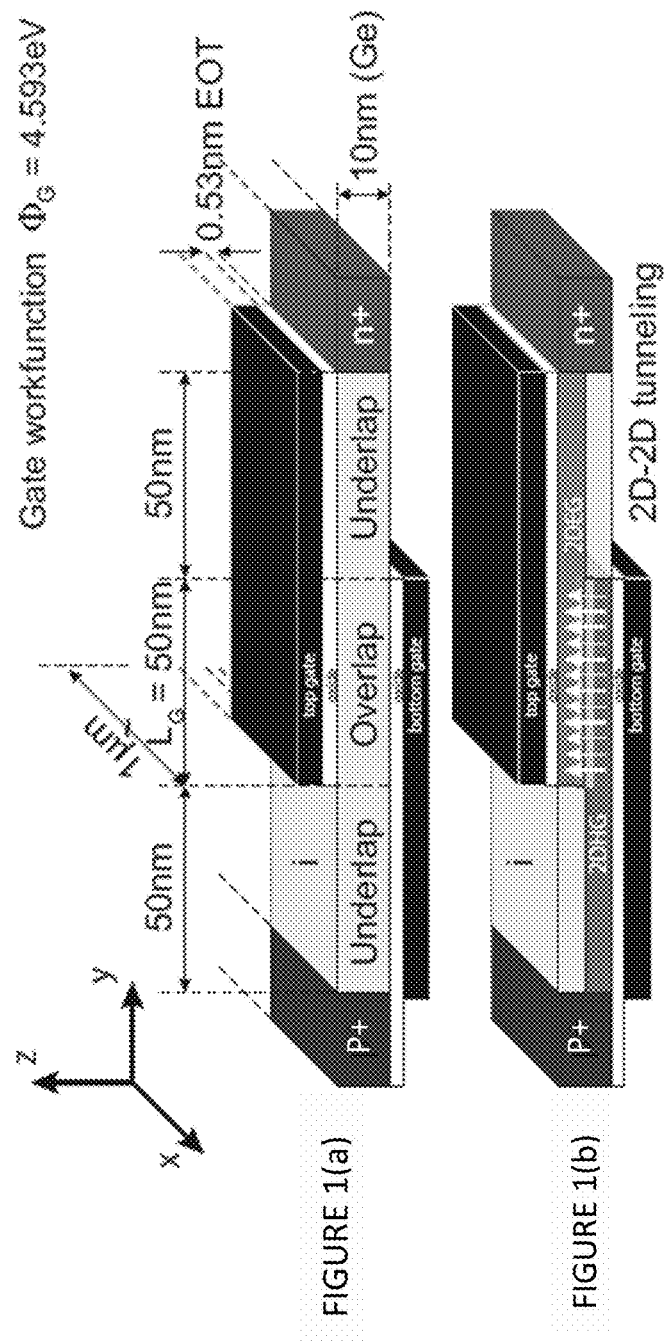
FIG. 1(a) shows an Electron Hole Bilayer Tunnel FET (EHBTFET) device structure and FIG. 1(b) shows the working principle of said device structure with the induced 2DEG and 2DHG and the band-to-band tunneling direction indicated as white arrows.

A primary advantage of the new device compared to the lateral implementation given in FIG. 1 is the ease of fabrication. The present invention provides a CMOS-compatible process flow which is achievable with a modest amount of effort (see FIG. 5).

Figure 5:
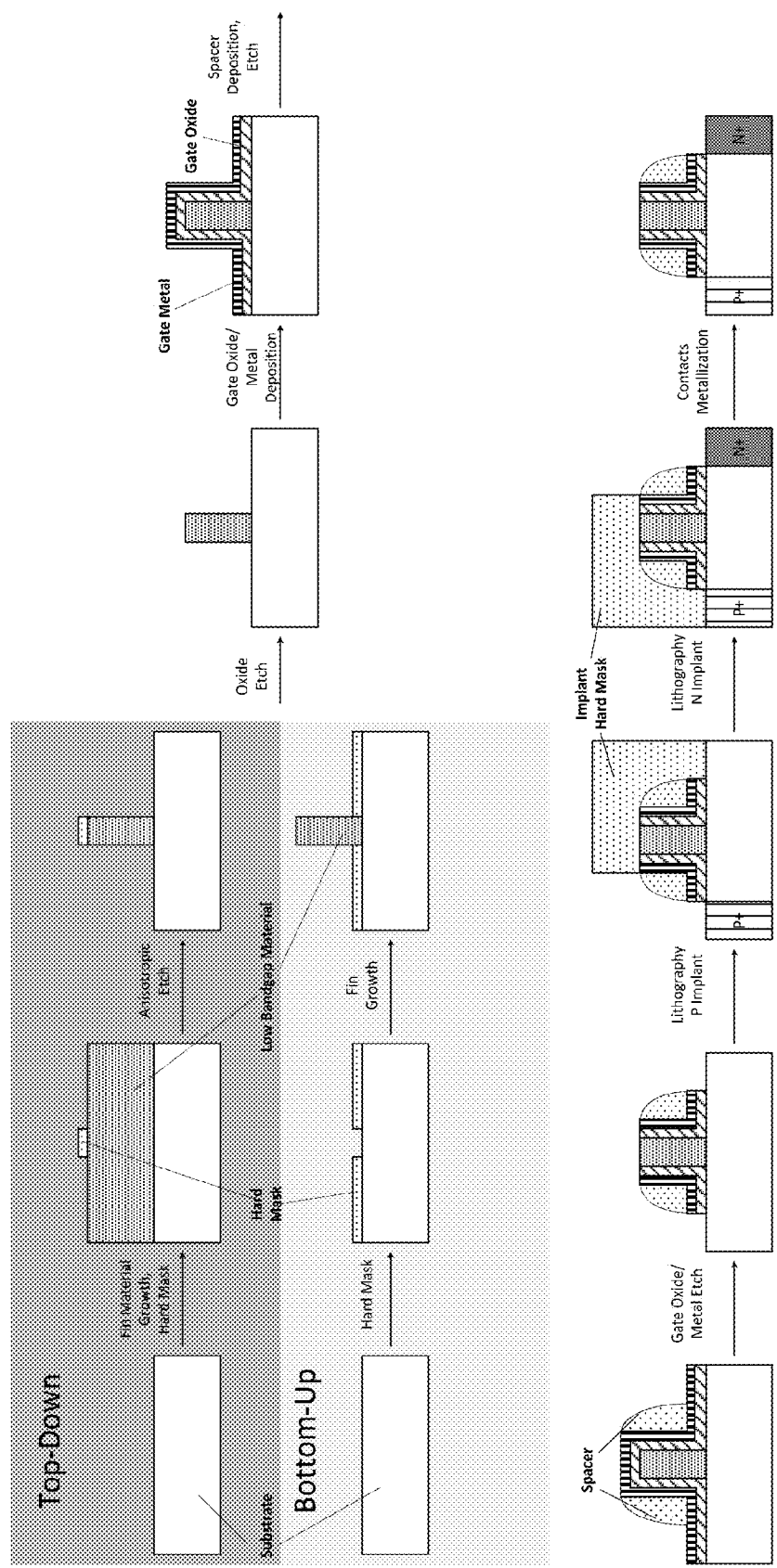
FIG. 5 illustrates an exemplary process flow for fabricating the device according to the present invention in which two different variants i.e. (Top-Down and Bottom-Up) are shown, each of which employ different methods for the initial formation of the low-bandgap semiconductor fin.

An exemplary preferred method of fabrication of the device according to the present invention is illustrated in FIG. 5.

The first step is the 'fin-growth' (fin structure realization) which can be done via two different approaches:

Top-Down Approach:
1—A layer of low bandgap semiconductor material 5 is deposited on the entire wafer substrate 3 using thin-film growth techniques that are commonly utilized in semiconductor fabrication such as epitaxial growth.
2—A hard mask of a silicon dioxide, silicon nitride or any other suitable material is grown or deposited.
3—An anisotropic etch such as RIE is performed.

Bottom-Up Approach:
1—A hard mask of a silicon dioxide, silicon nitride or any other suitable material is grown or deposited. Spacing for the fin-growth is opened using anisotropic etching.
2—A fin of low bandgap semiconductor material 5 is grown at the spacing that is opened.

From this point onwards the fabrication steps are the same for both approaches:
1—The hard mask is removed using a commonly known etching method.
2—An insulator oxide is conformally grown or deposited on the substrate 3 and on the fin 5 using atomic layer deposition or any other method. Gate metal is then deposited using for example sputter deposition or any other known method.
3—A spacer 31 of an insulating material such as silicon dioxide or silicon nitride is grown or deposited conformally.
4—The conformally grown or deposited spacer is etched anisotropically, leaving out spacers on the sides. The gate stack at the both sides is separated by etching the metal and the oxide on top of the fin by using for example CMP or any other known method.
5—An implant hard mask is grown or deposited and patterned using commonly used lithography techniques. An ion implantation of acceptors such as B or BF2 is performed to form the p+ doped regions. The implant mask is then removed.
6—A second implant hard mask is grown or deposited and patterned using commonly used lithography techniques. An ion implantation of donor such as As is performed to form the n+ doped regions. The implant mask is then removed.
7—Contacts and metallization is then performed.

Not only the device is easier to integrate on an integrated circuit, but it also intrinsically accounts for hetero-structures, as shown in FIG. 2. The low-bandgap region 5, where high BTBT rate is desired, is typically obtained by top-down or bottom-up fabrication techniques which are well-established for Germanium on Silicon [15], [16] or Indium Arsenide on Silicon [17] or in other III-V material configurations [7].

Figure 6:
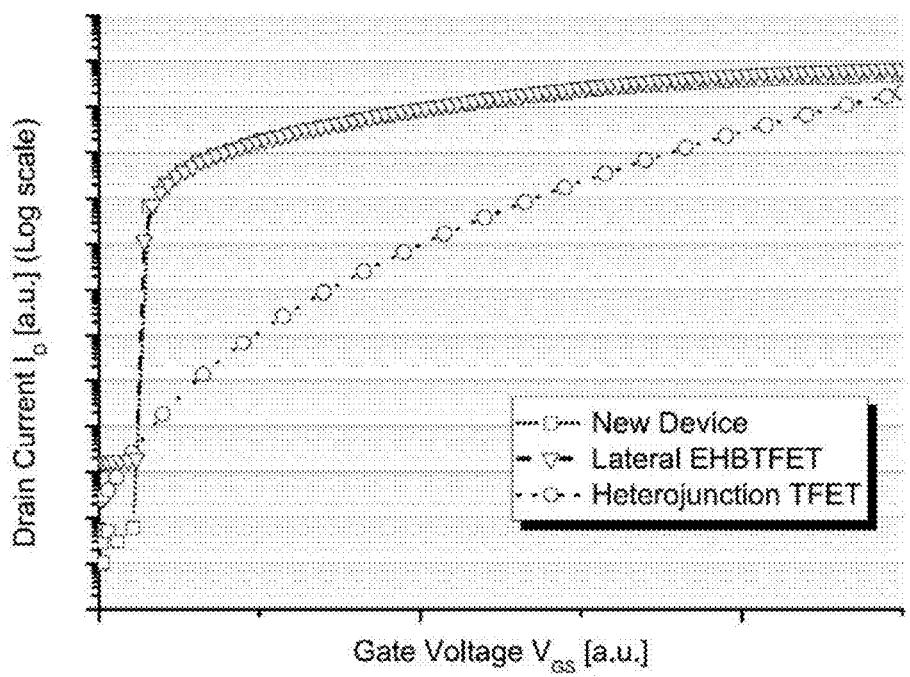
FIG. 6 shows the results of a semiclassical simulation of the device according to the present invention, as well as results for a 'conventional' heterojunction TFET structure from literature [14] included for comparison purposes.

The substrate 3 can be chosen to be a convenient large-bandgap material, such as an Indium Gallium Arsenide or Indium Phosphide alloy, that suppresses the leakage current in the substrate. We show (via TCAD simulations) that the invention offers lower OFF currents due to the large-bandgap material used in the substrate 3 and almost the same ON current compared to the lateral implementation of the EHBTFET (see FIG. 6).

Figure 7:
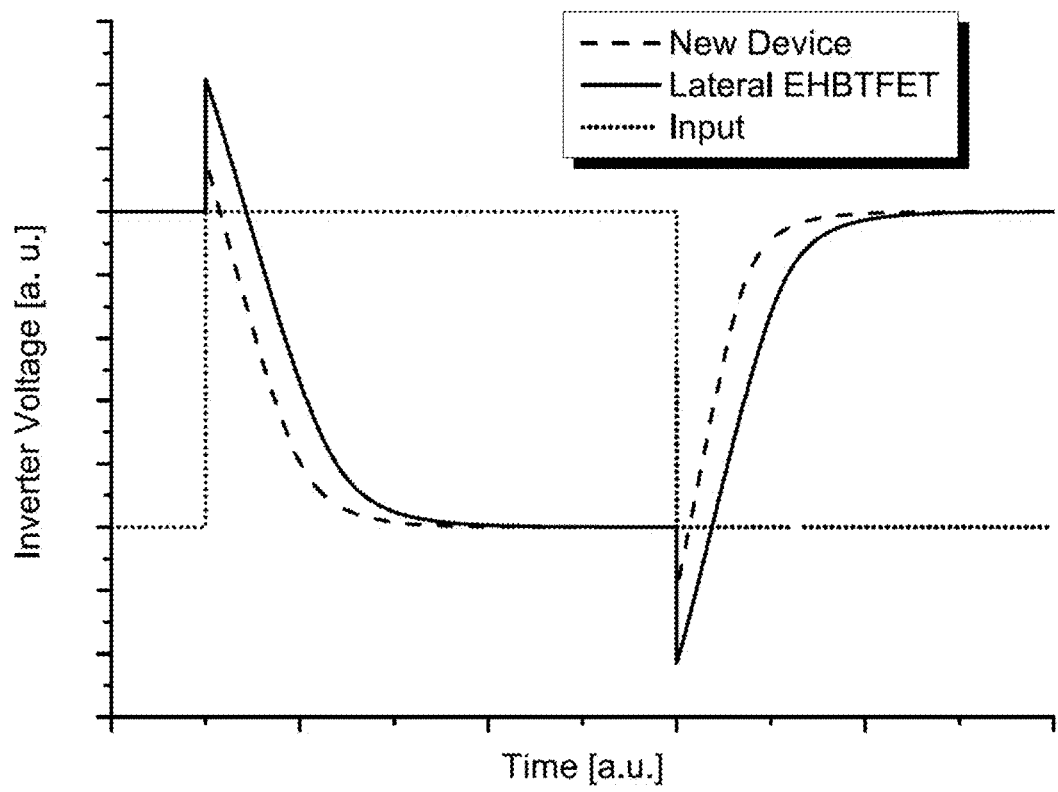
FIG. 7 illustrates inverter transient characteristics.

Furthermore, the use of larger bandgap materials for the substrate region 3 also results in a decreased device capacitance, which in turn reduces the dynamic power consumption of the device. This claim is also supported by TCAD transient simulations (see FIG. 7), which indicate that the inverter consisting of two complementary implementations of the invention (p- and n-type) exhibits reduced voltage overshoot during switching, which is a footprint of the lower device capacitance.

Figure 8:
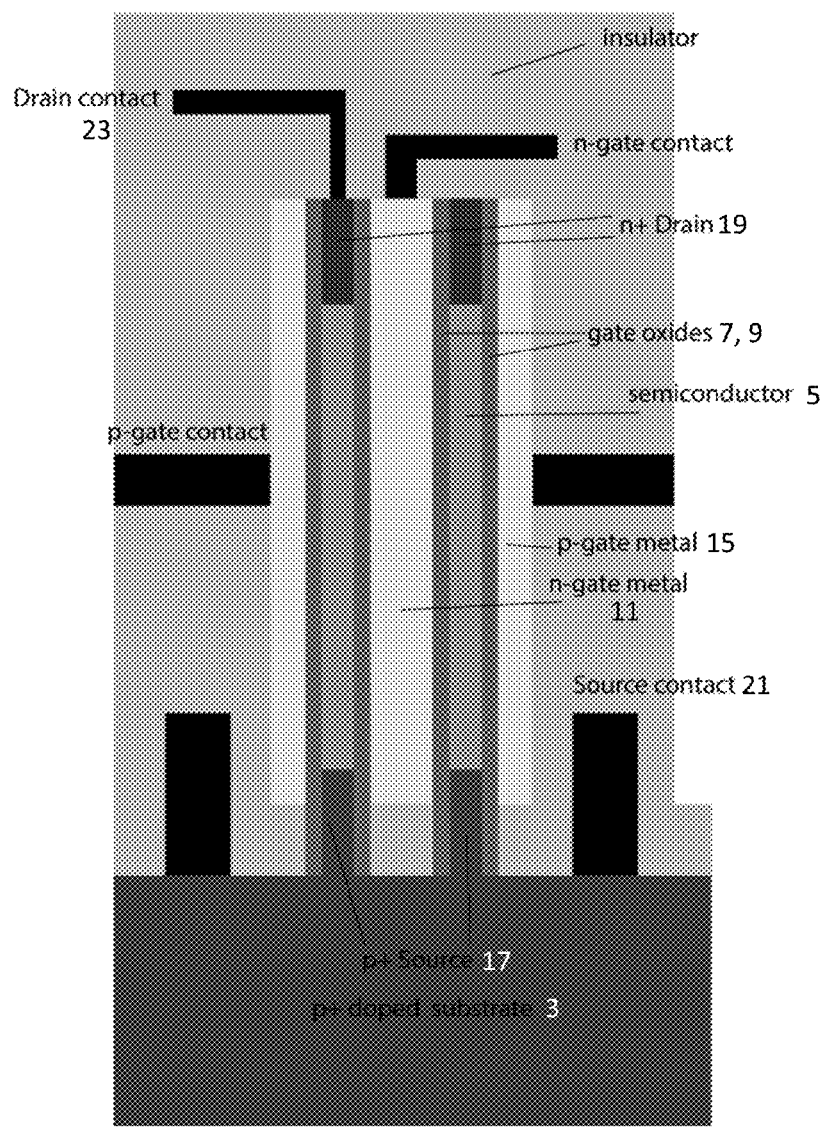
FIG. 8(a) illustrates a vertical cross sectional view of a device according to the present invention.
FIG. 8(b) is a vertical cross sectional view showing the electron and hole inversion layers.
FIG. 8(c) is a horizontal cross sectional view of the device of FIG. 8(a)
FIG. 8(d) is a horizontal cross sectional view of the device of FIG. 8(b) in which the Induced electron and hole inversion layers are illustrated and the BTBT direction is denoted as arrows.
FIG. 8(e) is a more detailed cross sectional view of the device of FIG. 8(a)
FIG. 8(f) is a horizontal cross sectional view of the device of FIG. 8(e) showing the top contact region of the device.
FIG. 8(g) illustrates an exemplary process flow for fabricating the device of FIG. 8(a) according to the present invention.
FIG. 8(h) is a vertical cross sectional view of a device fabricated according to the process flow of FIG. 8(g)
Figure 8:
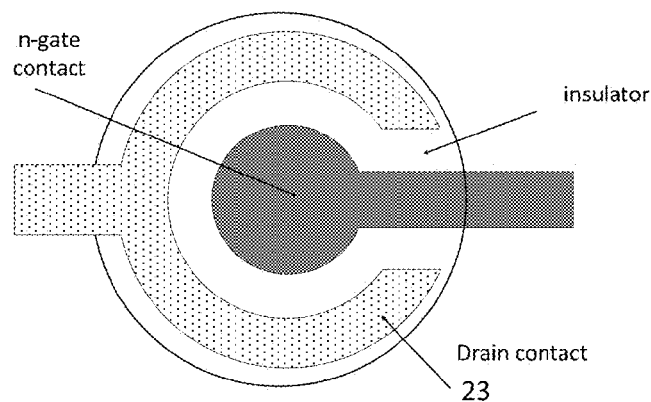
Figure 8:
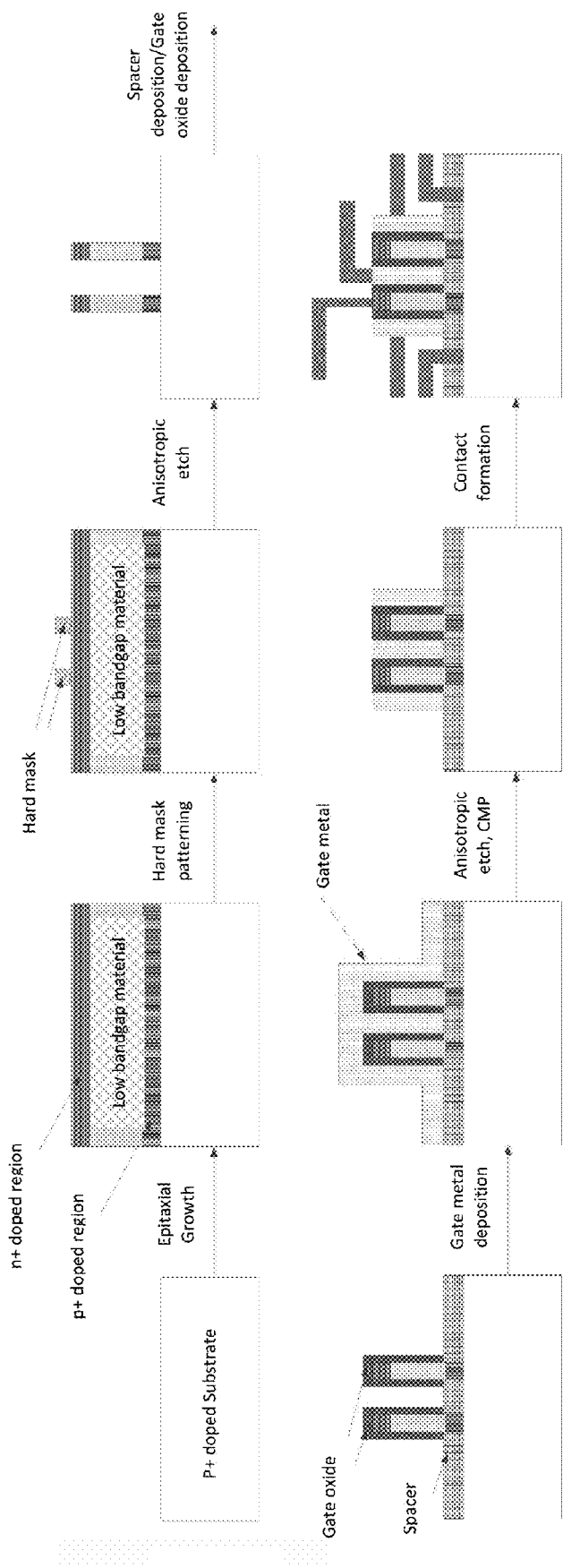
Figure 8:
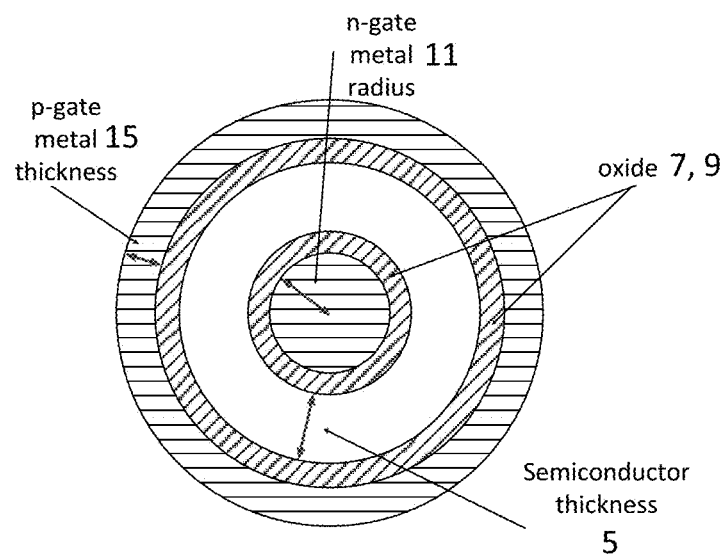

The idea of creating electron and hole inversion layers using electrostatics, achieving conduction by inter-layer BTBT can be applied to a variety of different device structures as seen in the device according to the present invention. According to a particular embodiment of the present invention, the same principle is exploited in the case of a substantially cylindrical structure such as a nanowire. FIGS. 8 (a) to (d) illustrate the vertical and horizontal cross sections of the nanowire embodiment of the same device according to the present invention.

The nanowire semiconductor device comprises of four terminals, n-gate 11, p-gate 15, source 21 and drain 23 (see FIG. 8(b)).

The n-gate 11 and p-gate 15 terminals are used to control the voltage bias on the two gate stacks for the formation of the electron and hole inversion layers 25, 27, respectively (see FIG. 8(d)). The device utilizes band-to-band tunneling (BTBT).

FIG. 8(e) shows a more detailed cross sectional view of the nanowire semiconductor device. FIG. 8(f) shows a horizontal cross sectional view of the device of FIG. 8(e) showing the top contact region of the device. The n-gate contact and drain contact 23 are at different height levels as can be seen in FIG. 8(e). The gate stacks consist of or comprise substantially ring-shaped dielectric (SiO2, HfO2 or any other insulator material) layers 7, 9 and gate contact material 11, 15 (metal or any other appropriate alloy).

The semiconductor 5 and the p-gate 15 are annular in cross-section and each has the form of an elongated ring. The n-gate 11 has the form of a solid cylinder and is located in the center of the device. The semiconductor 5 encloses the n-gate 11, and the p-gate 15 encloses the semiconductor 5.

The dielectric layer 9 is positioned between the p-gate 15 and the semiconductor 5. The dielectric layer 7 is positioned between the n-gate 11 and the semiconductor 5.

The n+ drain region 19 and the p1 region 17 are both formed in the semiconductor 5 (see FIG. 8(e)).

The low bandgap semiconductor 5 forms, for example, an elongated annular fin structure extending substantially perpendicularly outwards from the surface of the substrate 3.

The protruding fin structure can optionally be, for example, encapsulated or enclosed in an insulator material. A portion of the device contacts can for example be left exposed to facilitate electric connection and operation of the device.

BTBT is enabled when the quantized energy levels of the electron and hole gases align.

FIG. 8(g) illustrates an exemplary method for fabricating the nanowire semiconductor device of the present invention. The fabrication method is now described.

1—A layer of low bandgap semiconductor material 5 is deposited on the entire wafer substrate 3 using thin-film growth techniques that are commonly utilized in semiconductor fabrication such as epitaxial growth. Prior to the deposition of the low bandgap semiconductor material 5, a p+ doped layer of a different material to that of the substrate can optionally be deposited on the substrate 3. An n+ doped layer of the same or a different material to that of the substrate 3 is formed or deposited on the semiconductor material 5.

2—A hard mask of a silicon dioxide, silicon nitride or any other suitable material is grown or deposited as a ring shape (shown in cross section in FIG. 8(g)).

3—An anisotropic etch such as RIE is performed. The hard mask is removed using commonly known etching methods.

4—An insulator layer is grown non-conformally on the substrate 3 to form the spacer. An insulator oxide is conformally grown or deposited on the substrate 3 and on the fin structure using atomic layer deposition or any other known method. Gate metal is then deposited using sputter deposition or any other known method.

5—The gate metal is etched using anisotropic etching. The remaining oxide and metal on top of the nanowire is etched using CMP for example.

6—Contacts and metallization is then performed.

Table 2 below with reference to FIG. 8(h) provides exemplary values for typical dimensions of the principal characteristic features of the nanowire semiconductor device according to the present invention.

TABLE 2

| Nanowire height | 100-200 nm |
| Fin height | 30-100 nm |
| Fin length | 100 nm-1 μm |
| Gate oxide thickness | 1.3 nm-3 nm |
| n-gate metal radius | 50 nm |

TABLE 2-continued

| Semiconductor thickness | 10-20 nm |
| p-gate thickness | 50 nm |
| Spacer height | 50 nm |
| N+/P+ regions height | 50 nm |

The present invention further concerns logic circuits or gates comprising the above described device according to the present invention and a new logic scheme implementing logic functions.

Figure 9:
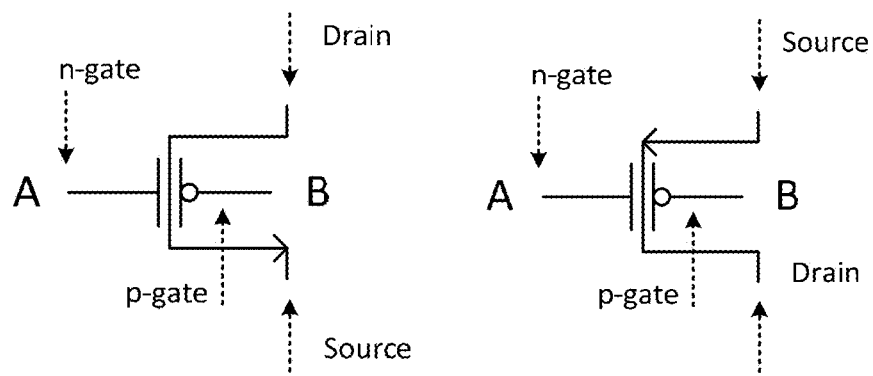
FIG. 9(a) illustrates a circuit schematic symbol for a Pull-Down (similar to NMOS) device according to the present invention where the device conducts only when A=logic-1 B=logic-0.
FIG. 9(b) illustrates a circuit schematic symbol for a Pull-Up (similar to PMOS) device according to the present invention where the device also conducts only when A=logic-1 B=logic-0.

Another important aspect of the device is its bipolar nature, which has interesting implications in terms of circuit design. The gate metal workfunctions can be chosen such that the device is only conducting when the n-gate input is logic-1 and the p-gate input is logic-0. This configuration is equivalent of having an NMOS and a PMOS in series (but using only a single device) which is also highlighted in the device schematic symbol (see FIGS. 9(a) and (b)).

This new logic scheme allows implementation of logic functions with significant reduction in transistor count. The reduction stems from the fact that a single device of the present invention is able to implement the logic function $F = A\bar{B}$ (or $F = \overline{A\bar{B}}$, depending on the circuit configuration).

Here we present a few of the basic logic standard operation, namely NAND, NOR and XOR (FIG. 10). For NAND and NOR operations, the transistor count is the same as the CMOS counterparts, however we see a 50% decrease in transistor count in the XOR operation (6 transistor in proposed logic scheme compared to 12 in standard CMOS implementation) which should provide an additional improvement in both area and speed.

Figure 11:
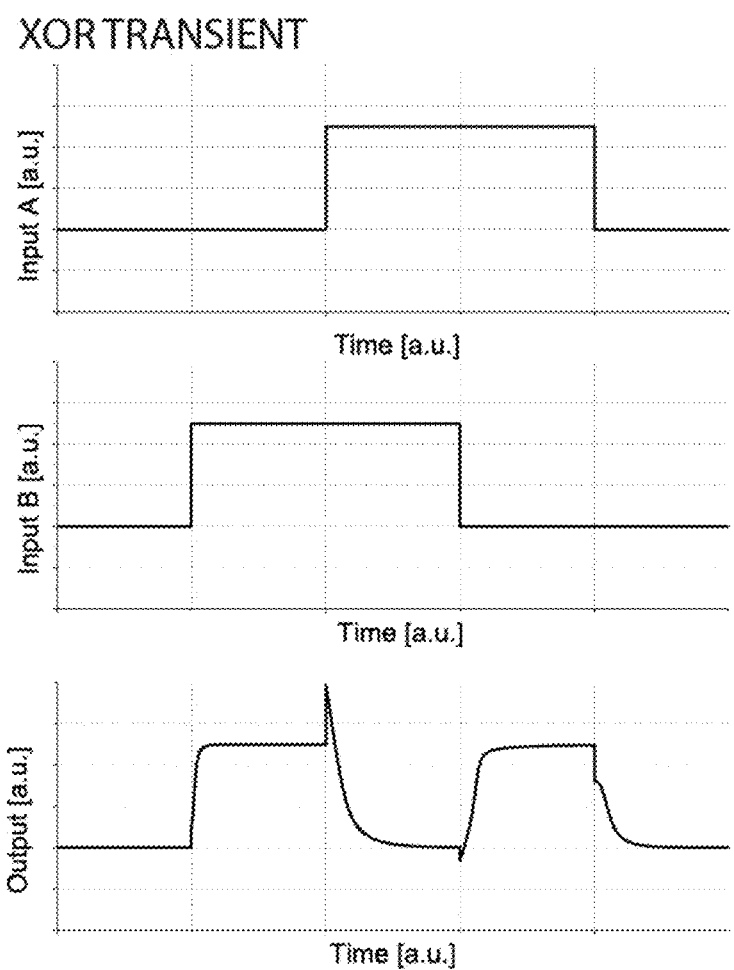
FIG. 11 shows XOR Transient Simulations.
Figure 12:
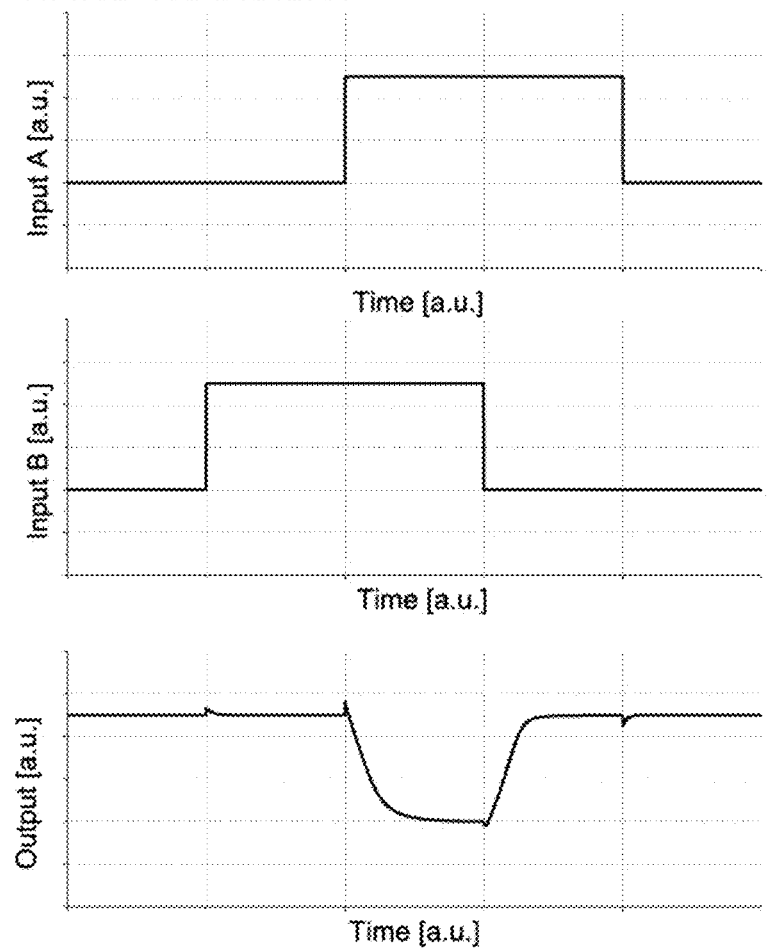
FIG. 12 shows NAND Transient Simulations.

We verify the proposed logic scheme by simulating the XOR gate in TCAD (see FIG. 11). As seen in the schematic figures, two different devices were used to implement the pull-up and pull-down parts of the circuits, respectively. The only difference between the pull-up and pull-down devices is the gate metal workfunctions used. The device structure is exactly the same in both devices due to its bipolar nature.

The new device architecture as described herein can be integrated on advanced Silicon CMOS platforms, which offers an economic advantage. It complements CMOS technology by extending its ability to operate at voltages below 0.5V and will enable an extended design space for digital and analog ICs, with main emphasis on low-power applications.

Having described now the preferred embodiments of this invention, it will be apparent to one of skill in the art that other embodiments incorporating its concept may be used. This invention should not be limited to the disclosed embodiments, but rather should be limited only by the scope of the appended claims.

REFERENCES

[1] A. M. Ionescu and H. Riel, "Tunnel field-effect transistors as energy-efficient electronic switches," *Nature*, vol. 479, no. 7373, pp. 329-37, November 2011.

[2] J. Knoch and J. Appenzeller, "A novel concept for field-effect transistors—the tunneling carbon nanotube FET," in *63rd Device Research Conference Digest*, 2005. DRC '05., 2005, vol. 1, pp. 153-156.

[3] L. Esaki, "New Phenomenon in Narrow Germanium p-n Junctions," *Phys. Rev.*, vol. 109, no. 2, pp. 603-604, January 1958.

[4] S. H. Kim, H. Kam, C. Hu, and T. K. Liu, "Germanium-Source Tunnel Field Effect Transistors with Record High ION/I OFF," *Technology*, pp. 178-179, 2009.

[5] F. Mayer, C. Le Royer, J.-F. Damlencourt, K. Romanjek, F. Andrieu, C. Tabone, B. Previtali, and S. Deleonibus, "Impact of SOI, $Si_{1-x}Ge_{x}OI$ and GeOI substrates on CMOS compatible Tunnel FET performance," 2008 *IEEE Int. Electron Devices Meet.*, vol. 4, pp. 1-5, December 2008.

[6] J. Wan, C. Le Royer, a. Zaslaysky, and S. Cristoloveanu, "Tunneling FETs on SOI: Suppression of ambipolar leakage, low-frequency noise behavior, and modeling," *Solid. State. Electron.*, vol. 65-66, pp. 226-233, November 2011.

[7] G. Dewey, B. Chu-Kung, J. Boardman, J. M. Fastenau, J. Kavalieros, R. Kotlyar, W. K. Liu, D. Lubyshev, M. Metz, N. Mukherjee, P. Oakey, R. Pillarisetty, M. Radosavljevic, H. W. Then, and R. Chau, "Fabrication, characterization, and physics of III-V heterojunction tunneling Field Effect Transistors (H-TFET) for steep sub-threshold swing," 2011 *Int. Electron Devices Meet., vol.* 3, pp. 33.6.1-33.6.4, December 2011.

[8] L. Lattanzio, L. De Michielis, and A. M. Ionescu, "Electron-hole bilayer tunnel FET for steep subthreshold swing and improved ON current," in 2011 *Proceedings of the European Solid-State Device Research Conference (ESSDERC)*, 2011, pp. 259-262.

[9] C. Alper, L. Lattanzio, L. De Michielis, P. Palestri, L. Selmi, and A. M. Ionescu, "Quantum Mechanical Study of the Germanium Electron-Hole Bilayer Tunnel FET," *IEEE Trans. Electron Devices*, vol. 60, no. 9, pp. 2754-2760, September 2013.

[10] L. Lattanzio, N. Dagtekin, L. De Michielis, and A. M. Ionescu, "On the Static and Dynamic Behavior of the Germanium Electron-Hole Bilayer Tunnel FET," *IEEE Trans. Electron Devices, vol.* 59, no. 11, pp. 2932-2938, November 2012.

[11] L. Lattanzio, L. De Michielis, and A. M. Ionescu, "The electron-hole bilayer tunnel FET," *Solid. State. Electron.*, vol. 74, pp. 85-90, August 2012.

[12] L. Lattanzio, L. De Michielis, and A. M. Ionescu, "Complementary Germanium Electron-Hole Bilayer Tunnel FET for Sub-0.5-V Operation," *IEEE Electron Device Lett.*, vol. 33, no. 2, pp. 167-169, February 2012.

[13] S. Agarwal and E. Yablonovitch, "Using dimensionality to achieve a sharp tunneling FET (TFET) turn-on," in 69*th Device Research Conference,* 2011, vol. 51, no. July 1961, pp. 199-200.

[14] C. Alper, L. De Michielis, N. Dagtekin, L. Lattanzio, and A. M. Ionescu, "Tunnel FET with non-uniform gate capacitance for improved device and circuit level performance," 2012 *Proc. Eur. Solid-State Device Res. Conf.*, vol. 2, pp. 161-164, September 2012.

[15] B. Vincent, L. Witters, O. Richard, A. Hikavyy, H. Bender, R. Loo, M. Caymax, and A. Thean, "Selective Growth of Strained Ge Channel on Relaxed SiGe Buffer in Shallow Trench Isolation for High Mobility Ge Planar and Fin p-FET," *ECS Trans.*, vol. 50, no. 9, pp. 39-45, March 2013.

[16] C.-T. Chung, C.-W. Chen, J.-C. Lin, C.-C. Wu, C.-H. Chien, and G.-L. Luo, "First experimental Ge CMOS FinFETs directly on SOI substrate," 2012 *Int. Electron Devices Meet.*, pp. 16.4.1-16.4.4, December 2012.

[17] H. Schmid, K. E. Moselund, M. T. Björk, M. Richter, H. Ghoneim, C. D. Bessire, and H. Riel, "Fabrication of Vertical InAs—Si Heterojunction Tunnel Field Effect Transistors," vol. 29, pp. 2010-2011, 2011.

What is claimed is:

1. A semiconductor tunneling Field-Effect device including:
    a source;
    a drain;
    at least one elongated semiconductor structure extending in an elongated direction;
    a first gate; and
    a second gate,
    wherein the first gate has a length extending in said elongated direction and is positioned on a first side of the at least one elongated semiconductor structure, and the second gate has a length extending in said elongated direction and is positioned on a second opposing side of the at least one elongated semiconductor structure,
    wherein the first and second gates extend along the first and second sides of the at least one elongated semiconductor structure to define an overlap zone sandwiched between the first gate and the second gate, said overlap zone extending the full length of the first and/or second gate along the at least one elongated semiconductor structure,
    wherein the at least one elongated semiconductor structure and the first gate are annular in cross-section and the second gate has the form of a solid cylinder, and
    wherein the at least one elongated semiconductor structure encloses the second gate and the first gate encloses the at least one elongated semiconductor structure.

2. The device according to claim 1, wherein the device further includes a first dielectric layer positioned between the first gate and the at least one elongated semiconductor structure, and a second dielectric layer positioned between the second gate and the at least one elongated semiconductor structure.

3. The device according to claim 1, wherein the second gate is mirror symmetrically positioned on the second side of the at least one elongated semiconductor structure with respect to the first gate on the first side of the at least one elongated semiconductor structure.

4. The device according to claim 1, the device further including a substrate, the at least one elongated semiconductor structure extending substantially perpendicularly outwards from a surface of the substrate to form a Fin structure including substantially vertical or upwardly extending sidewalls.

5. The device according to previous claim 2, wherein the first and second dielectric layers are substantially L-shaped in cross-section, the first dielectric layer (9) comprises a base section in contact with the substrate and a substantially upper section extending from the base section and that is in contact with the first side of the at least one elongated semiconductor structure, and the second dielectric layer comprises a base section in contact with the substrate and a substantially upper section extending from the base section and that is in contact with the opposing second side of the at least one elongated semiconductor structure.

6. The device according to claim 1, wherein the second gate and the second dielectric layer are mirror symmetrically positioned on the second side of the at least one elongated semiconductor structure with respect to the first gate and the first dielectric layer on the first side of the at least one elongated semiconductor structure.

7. The device according to claim 1, wherein the device includes a first and second spacer region, the first spacer region being deposited on the first dielectric layer and the second spacer region being deposited on the second dielectric layer.

8. The device according to claim 1, wherein the substrate includes a source region and a drain region of opposite conductivity types, as well as a drain terminal connected to the drain region and a source terminal connected to the source region.

9. The device according to claim 1, wherein the substrate comprises or consists of a first material and the at least one elongated semiconductor structure comprises or consists of a second material, the first material having a larger band-gap than the second material.

10. The device according to claim 1, the device further including a first annular dielectric layer positioned between the first gate and the at least one elongated semiconductor structure, and a second annular dielectric layer positioned between the second gate and the at least one elongated semiconductor structure.

11. The device according to claim 1, wherein the device is configured to form an electron inversion layer and a hole inversion layer by controlling a voltage bias applied to the first gate and the second gate.

12. The device according to claim 1, wherein the device is configured to form an electron inversion layer and a hole inversion layer by applying an asymmetric bias to the first gate and the second gate.

13. The device according to claim 1, wherein the device is configured such that Band To Band Tunneling is enabled when quantized energy levels of electron and hole gases align.

14. The device according to claim 1, wherein the device is configured to combine n-type and p-type transistor behavior to implement digital logic function.

15. The device according to claim 1, wherein the device is an electron hole bilayer tunnel field effect transistor.

16. Logic cell or device including at least one semiconductor tunneling Field-Effect device including:
    a source;
    a drain;
    at least one elongated semiconductor structure extending in an elongated direction;
    a first gate; and
    a second gate,
    wherein the first gate has a length extending in said elongated direction and is positioned on a first side of the at least one elongated semiconductor structure, and the second gate has a length extending in said elongated direction and is positioned on a second opposing side of the at least one elongated semiconductor structure,
    wherein the first and second gates extend along the first and second sides of the at least one elongated semiconductor structure to define an overlap zone sandwiched between the first gate and the second gate, said overlap zone extending the full length of the first and/or second gate along the at least one elongated semiconductor structure,
    wherein the at least one elongated semiconductor structure and the first gate are annular in cross-section and the second gate has the form of a solid cylinder, and
    wherein the at least one elongated semiconductor structure encloses the second gate and the first gate encloses the at least one elongated semiconductor structure.

17. Logic cell or device according to the claim 16 wherein said Logic cell or device is an inverter, a NAND gate, a NOR gate or a XOR gate.

18. A method of operating a device, including the steps of:
    providing a semiconductor tunneling Field-Effect device including:
        a source;
        a drain;
        at least one elongated semiconductor structure extending in an elongated direction;
        a first gate; and
        a second gate,
        wherein the first gate has a length extending in said elongated direction and is positioned on a first side of the at least one elongated semiconductor structure, and the second gate has a length extending in said elongated direction and is positioned on a second opposing side of the at least one elongated semiconductor structure,
        wherein the first and second gates extend along the first and second sides of the at least one elongated semiconductor structure to define an overlap zone sandwiched between the first gate and the second gate, said overlap zone extending the full length of the first and/or second gate along the at least one elongated semiconductor structure,
        wherein the at least one elongated semiconductor structure and the first gate are annular in cross-section and the second gate has the form of a solid cylinder,
        wherein the at least one elongated semiconductor structure encloses the second gate and the first gate encloses the at least one elongated semiconductor structure, and
    biasing both of the first gate and the second gate to enable Band To Band Tunneling when the quantized energy levels of electron and hole gases are aligned to permit conduction.

* * * * *